United States Patent
Wong et al.

(10) Patent No.: US 7,167,405 B1
(45) Date of Patent: Jan. 23, 2007

(54) DATA TRANSFER VERIFICATION SYSTEMS AND METHODS

(75) Inventors: Jack T. Wong, Fremont, CA (US); Kory Gong, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/230,087

(22) Filed: Sep. 19, 2005

(51) Int. Cl.
*G11C 29/00* (2006.01)
*G11C 7/00* (2006.01)

(52) U.S. Cl. .......................... 365/201; 365/63
(58) Field of Classification Search ................ 365/201, 365/63, 52
See application file for complete search history.

(56) References Cited

U.S. PATENT DOCUMENTS

| | | | |
|---|---|---|---|
| 5,548,228 A | 8/1996 | Madurawe | |
| 5,640,107 A | 6/1997 | Kruse | |
| 5,696,455 A | 12/1997 | Madurawe | |
| 6,049,222 A | 4/2000 | Lawman | |
| 6,198,663 B1 * | 3/2001 | Takizawa | 365/185.29 |
| 6,538,468 B1 | 3/2003 | Moore | |
| 6,774,668 B1 * | 8/2004 | Wirtz, II | 326/37 |
| 6,828,823 B1 | 12/2004 | Tsui et al. | |
| 6,876,228 B1 * | 4/2005 | Sunaga et al. | 326/40 |
| 7,073,094 B1 * | 7/2006 | Jackson et al. | 714/30 |

OTHER PUBLICATIONS

U.S. Appl. No. 10/783,886, filed Feb. 20, 2004, Agrawal et al.
Actel Corporation, "ProASIC$^{PLUS}$ Flash Family FPGAs", Dec. 2003, pp. i-iv and 1-1-1-25.
Actel Corporation, "ProASIC$^{PLUS}$ Flash Family FPGAs", Aug. 2005, pp. i-iv, 1-1-1-74, and 2-1-2-87.
Lattice Semiconductor Corporation, "ispXPGA™ Family", Preliminary Data Sheet, Sep. 2003, pp. 1-21.
Lattice Semiconductor Corporation, "ispXPGA® Family", Data Sheet, Jul. 2005, pp. 1-20.

* cited by examiner

*Primary Examiner*—Anh Phung
(74) *Attorney, Agent, or Firm*—MacPherson Kwok Chen & Heid LLP; Brent A. Folsom

(57) ABSTRACT

Systems and methods are directed to verification of configuration data stored in memory cells. For example, in one embodiment, an integrated circuit includes a first plurality of memory cells including a first set of test memory cells. A second plurality of memory cells is adapted to receive and store data provided from the first plurality of memory cells. The second plurality of memory cells include a second set of test memory cells corresponding to the first set of test memory cells. A comparator is adapted to compare stored data from the second set of test memory cells with the data values of the first set of test memory cells. Control circuitry is responsive to the comparator to control whether additional data from the first plurality of memory cells is loaded to the second plurality of memory cells.

20 Claims, 2 Drawing Sheets

DATA TRANSFER VERIFICATION SYSTEMS AND METHODS

TECHNICAL FIELD

The present invention relates generally to electrical circuits and, more particularly, to memory.

BACKGROUND

Modern integrated circuits, such as programmable logic devices (PLDs) and other electronic devices, are often configured to begin operation shortly after being powered on. Such "instant-on" behavior, for example, may involve the loading of configuration data from non-volatile memory cells to volatile memory cells of a device.

In certain applications, configuration data may be downloaded from non-volatile memory cells of a device to volatile memory cells of the device implemented as SRAM cells. Typically, such loading is performed immediately after the device is powered on, such as in response to the release of a power-up reset signal. After a successful download of configuration data, the programmed features of the device may be utilized.

Unfortunately, such conventional approaches to the loading of the volatile memory cells can introduce errors during the programming of the configuration data in the volatile memory cells. For example, if the power supplied to the device (such as power supplied through a Vcc pin) is insufficiently high or unstable during power-up, the PLD may not be prepared to perform a reliable transfer of the configuration data. As a result, corrupt configuration data may be stored in the volatile memory cells, thereby causing unreliable operation of the PLD. Accordingly, there is a need for an improved approach to the loading of configuration data from non-volatile memory cells into volatile memory cells.

SUMMARY

In accordance with one embodiment of the present invention, an integrated circuit includes a first plurality of memory cells including a first set of test memory cells; a second plurality of memory cells adapted to receive and store data provided from the first plurality of memory cells, the second plurality of memory cells including a second set of test memory cells corresponding to the first set of test memory cells; a comparator adapted to compare stored data from the second set of test memory cells with data values of the first set of test memory cells; and control circuitry responsive to the comparator to control whether additional data from the first plurality of memory cells is loaded to the second plurality of memory cells.

In accordance with another embodiment of the present invention, an integrated circuit includes a first plurality of memory cells; a second plurality of memory cells; means for providing data from a portion of the first plurality of memory cells to a portion of the second plurality of memory cells; means for comparing data values stored in the portion of the second plurality of memory cells with data values of the portion of the first plurality of memory cells; and means for controlling whether additional data from the first plurality of memory cells is loaded to the second plurality of memory cells.

In accordance with another embodiment of the present invention, a method of verifying data transfer within an integrated circuit includes providing data from a portion of a first plurality of memory cells to a portion of a second plurality of memory cells; storing the data provided from the first plurality of memory cells in the second plurality of memory cells; comparing data values stored in the portion of the second plurality of memory cells with data values of the portion of the first plurality of memory cells; and controlling whether additional data from the first plurality of memory cells is loaded to the second plurality of memory cells.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits that may transfer information from one memory to another memory. As an exemplary implementation, a PLD will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits and within the various types of integrated circuits.

Figure 1:
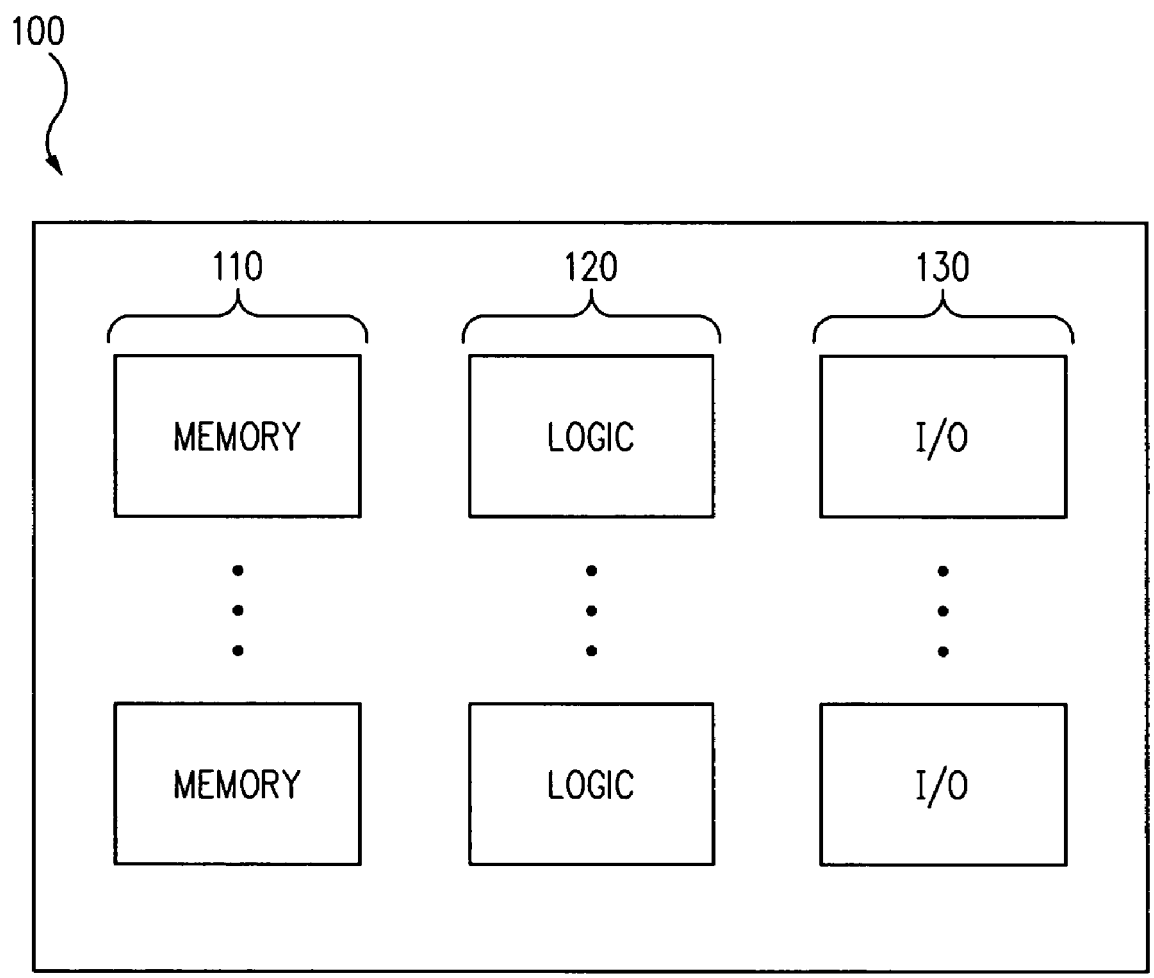
FIG. 1 illustrates a block diagram of an integrated circuit in accordance with an embodiment of the present invention.

FIG. 1 illustrates a block diagram of an integrated circuit 100 in accordance with an embodiment of the present invention. Integrated circuit 100 may represent any type of integrated circuit, such as for example a PLD or an application specific integrated circuit. For this exemplary implementation, integrated circuit 100 is shown in FIG. 1 as a PLD, but it should be understood that the various features described herein for one or more embodiments of the present disclosure may be applied to any appropriate product or application.

Integrated circuit 100 includes one or more memory blocks 110, one or more logic blocks 120, and one or more input/output (I/O) blocks 130. Memory blocks 110 may represent one or more arrays of non-volatile memory, such as flash memory cells, and/or any other type of volatile or non-volatile memory as may be required by application or specification requirements of integrated circuit 100. Logic blocks 120 may be optionally included as part of integrated circuit 100 and may represent lookup table logic or logic arrays or any other type of logic as may be required. I/O blocks 130 represent optional I/O interfaces for integrated circuit 100.

For example, in one embodiment, memory blocks 110 can be implemented as flash memory, and logic blocks 120 implemented as lookup tables, registers, and SRAM, with the SRAM implemented to provide SRAM configuration bits for the PLD. As such, the SRAM cells can be programmed by the flash memory cells through a one-to-one mapping between addresses of the flash memory cells and addresses of the SRAM configuration bits to configure the PLD, as would be understood by one skilled in the art.

It should be understood that any number of memory blocks 110, logic blocks 120, and/or I/O blocks 130 may be independently implemented and are not limited in any fashion. Furthermore, memory blocks 110, as well as logic blocks 120 and/or I/O blocks 130, if implemented, may be arranged in any desired fashion within integrated circuit 100.

Figure 2:
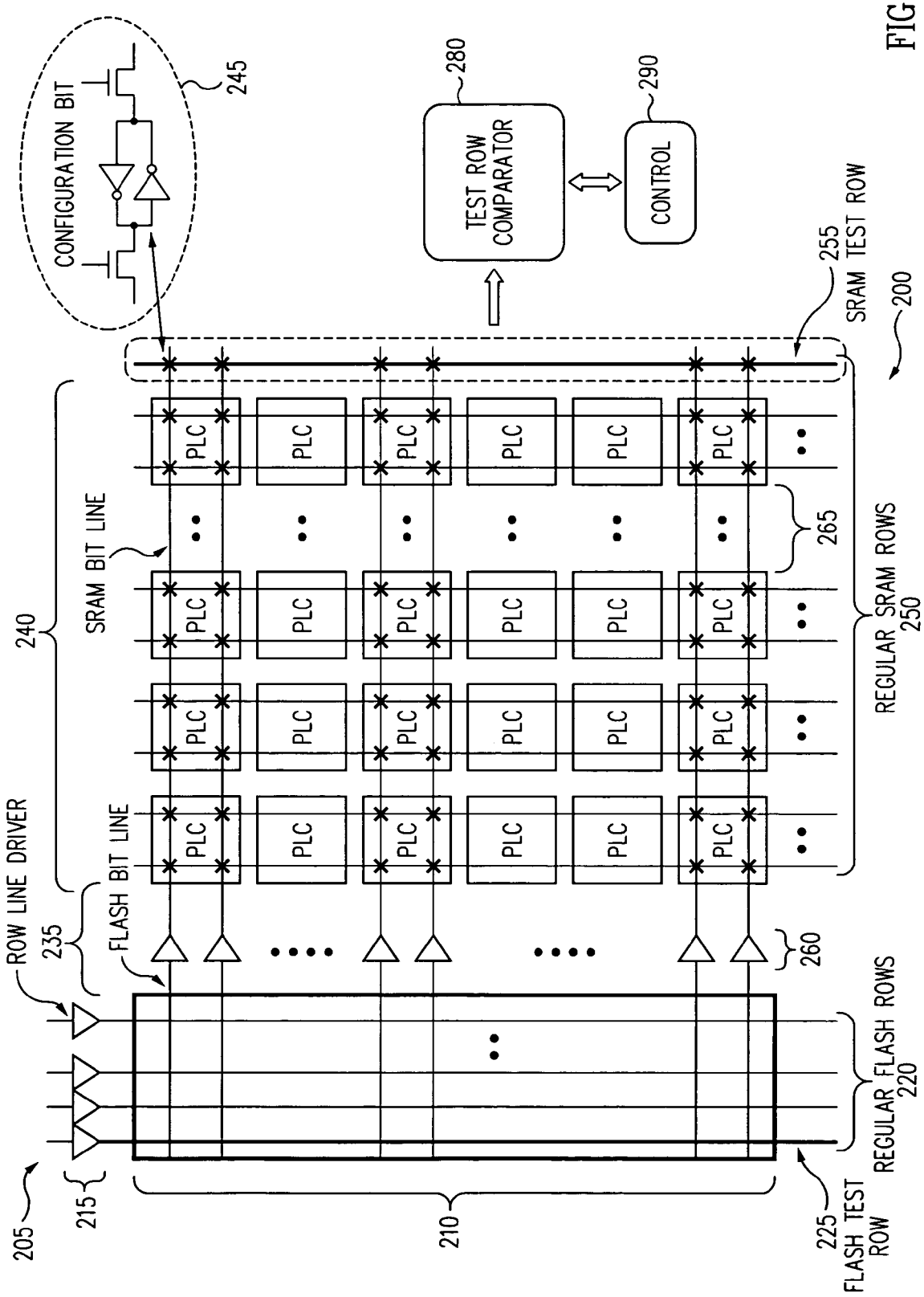
FIG. 2 illustrates a block diagram of an exemplary implementation of a flash memory block and a plurality of programmable logic cells in accordance with an embodiment of the present invention.

As an example, one memory block 110 may represent flash memory, while logic block 120 may represent a number of programmable logic cells (PLCs). For example, FIG. 2 illustrates a block diagram of a circuit 200, which is an exemplary implementation of memory blocks 110 and logic blocks 120. Circuit 200 includes a flash memory block 205 (e.g., representing one memory block 110) and a plurality of PLCs 240 (e.g., representing logic blocks 120) in accordance with an embodiment of the present invention.

Flash memory block 205 includes a plurality of flash memory cells 210 which can be arranged in a plurality of flash rows 220. At least one flash row 220 may be employed as a flash test row 225. In the embodiment set forth in FIG. 2, for example, flash test row 225 is provided for a power-up verification process as further described herein, and the remaining flash rows 220 are provided for normal operation of the flash memory block 205. As illustrated, a plurality of flash row line drivers 215 are also provided in circuit 200 and are associated with each of flash rows 220.

Each PLC 240 can include one or more volatile memory cells 245 (e.g., implemented as SRAM cells and identified with an "X" in FIG. 2) to store configuration bits. As illustrated, volatile memory cells 245 can be arranged in a plurality of SRAM rows 250, with at least one SRAM row 250 employed as a SRAM test row 255. In the embodiment set forth in FIG. 2, SRAM test row 255 is provided for a power-up verification process as further described herein, and the remaining SRAM rows 250 are provided for normal operation of the PLCs 240.

A plurality of flash bit line drivers 260 are associated with flash bit lines 235 and SRAM bit lines 265. Configuration data stored in flash memory cells 210 can be provided to volatile memory cells 245 through flash bit lines 235, flash bit line drivers 260, and SRAM bit lines 265.

A test row comparator 280 can receive data stored in SRAM test row 255 and compare this data with known data values stored in flash test row 225. It will be appreciated that the known data values can be provided to test row comparator 280 from flash test row 225 and/or from any other desired location where such values may be stored. For example, the expected data values may be known to test row comparator 280 without requiring test row comparator 280 to read the data values from flash test row 225. Control circuitry 290 for operating test row comparator 280 and managing a power-up verification process is also provided, as further described herein. In various embodiments, control circuitry 290 can be implemented as a general purpose processor, an application-specific processor, logic circuitry, and/or other appropriate circuitry.

Turning now to the power-up verification process, integrated circuit 100 is powered on and data from flash test row 225 is provided to SRAM test row 255 through flash bit lines 235, flash bit line drivers 260, and SRAM bit lines 265. SRAM test row 255 then attempts to store the provided data. Data is read from SRAM test row 255 and provided to test row comparator 280, which compares the data from SRAM test row 255 to known values of the data in flash test row 225. In one embodiment, test row comparator 280 performs an XOR comparison between the data from SRAM test row 255 and known values of the data in flash test row 225. If a match is not found, then test row comparator 280 can send out a logical "high" signal to indicate an error.

If a result of the comparison indicates a match, then the power provided to circuit 200 should be sufficiently stable to support a reliable download of a full set of configuration data from flash rows 220 to SRAM rows 250. Therefore, control circuitry 290 can then cause the configuration data to be loaded from the remainder of flash rows 220 into the remainder of SRAM rows 250, thereby programming volatile memory cells 245 and configuring PLCs 240.

However, if no match is found, then it can be interpreted that the power provided to circuit 200 is not yet sufficiently stable to support reliable download of configuration data from flash rows 220 to SRAM rows 250. As a result, control circuitry 290 can trigger flash test row 225 to again provide data to SRAM test row 255 which then attempts to store the provided data. Data read from SRAM test row 255 is again provided to test row comparator 280 where it is compared with the known values of data from flash row 225. The process can be repeated until matching data is found, indicating that power provided to circuit 200 is sufficiently stable to support a reliable download of a full set of configuration data from flash rows 220 to SRAM rows 250. Thereafter, control circuitry 290 can cause the configuration data to be loaded from the remainder of flash rows 220 into the remainder of SRAM rows 250, thereby programming volatile memory cells 245 and configuring PLCs 240.

Alternately, control circuitry 290 can be adapted to stop or prevent an otherwise automatic loading of the configuration data until the matching data is found. As an example, the configuration data may be automatically loaded from the remainder of flash rows 220 into the remainder of SRAM rows 250 immediately following the providing of the data from flash test row 225 to SRAM test row 255. In another example, automatic loading of the configuration data may take place after a temporary pause (i.e., a delay) following the providing of the data from flash test row 225 to SRAM test row 255. In either example, control circuitry 290 may cause automatic loading of the configuration data to be interrupted until the matching data is found.

It will be appreciated that the loading of configuration data from flash test row 225 into SRAM test row 255 utilizes electrical paths also employed for loading configuration data from flash rows 220 to SRAM rows 250. As a result, the power-up verification process described above can effectively simulate the loading of volatile memory cells 245 in order to determine whether the power supplied to circuit 200 is sufficiently stable to support a reliable download of a full set of configuration data from flash rows 220 to SRAM rows 250. Such an approach can significantly improve the reliability of configuration data that is ultimately downloaded and stored in volatile memory cells 245 of SRAM rows 250.

The power-up verification process set forth above has been described with reference to the embodiment illustrated in FIG. 2 using one flash test row 225 which corresponds to one SRAM test row 255. However, other variations of the process are also contemplated. For example, in another embodiment, flash test row 225 and SRAM test row 255 need not be provided. Instead, any one or more of flash rows 220 or portions of flash rows 220 can be used for providing data, such as configuration data, to any one or more desired SRAM rows 250 or portions of SRAM rows 250. It will be appreciated that by downloading such configuration data and performing a comparison of the provided data and stored data, the stability of power supplied to circuit 200 can be checked.

Although particular numbers of flash rows 220, test flash rows 225, SRAM rows 250, and SRAM test rows 255 have been illustrated in FIG. 2, it will be appreciated that any appropriate number of rows or partial rows may be used in accordance with the present disclosure as may be appropriate for particular applications. Moreover, although flash memory cells 210, PLCs 240, and volatile memory cells 245 are illustrated as being arranged in arrays in the embodiment of FIG. 2, it will be appreciated that such elements need not be limited to such forms.

It will further be appreciated that although particular embodiments of the present invention are described herein with reference to "rows," such term does not limit the scope of available embodiments. For example, the term "row" can refer to an entire row, a portion of a row, an entire column, a portion of a column, and/or any desired set or plurality of flash memory cells 210, PLCs 240, and volatile memory cells 245.

The verification process of the present disclosure can be applied to any appropriate technology employing flash memory cells or other non-volatile memories, which may be utilized for PLDs, standalone memory cards and drives, embedded systems, and other products.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a first plurality of memory cells including a first set of test memory cells;
   a second plurality of memory cells adapted to receive and store data provided from the first plurality of memory cells, the second plurality of memory cells including a second set of test memory cells corresponding to the first set of test memory cells;
   a comparator adapted to compare stored data from the second set of test memory cells with data values of the first set of test memory cells; and
   control circuitry responsive to the comparator to control whether additional data from the first plurality of memory cells is loaded to the second plurality of memory cells.

2. The integrated circuit of claim 1, wherein the control circuitry is adapted to load additional data from the first plurality of memory cells to the second plurality of memory cells if the comparator indicates that data values of the stored data in the second set of test memory cells match data values of the data provided from the first set of test memory cells.

3. The integrated circuit of claim 1, wherein the control circuitry is adapted to trigger the second set of test memory cells to again receive and store data provided from the first set of test memory cells if the comparator indicates that data values of the stored data do not match data values of the provided data.

4. The integrated circuit of claim 1, wherein the first plurality of memory cells are non-volatile memory cells, and wherein the second plurality of memory cells are volatile memory cells.

5. The integrated circuit of claim 1, wherein the first plurality of memory cells are flash memory cells, and wherein the second plurality of memory cells are SRAM cells.

6. The integrated circuit of claim 1, wherein the additional data is configuration data.

7. The integrated circuit of claim 1, wherein the first set of test memory cells is a test row of flash memory cells, and wherein the second set of test memory cells is a test row of SRAM memory cells.

8. The integrated circuit of claim 1, further comprising a plurality of programmable logic cells (PLCs) wherein each PLC comprises at least one memory cell of the second plurality of memory cells, and wherein the integrated circuit is a programmable logic device.

9. An integrated circuit comprising:
   a first plurality of memory cells;
   a second plurality of memory cells;
   means for providing data from a portion of the first plurality of memory cells to a portion of the second plurality of memory cells;
   means for comparing data values stored in the portion of the second plurality of memory cells with data values of the portion of the first plurality of memory cells; and
   means for controlling whether additional data from the first plurality of memory cells is loaded to the second plurality of memory cells.

10. The integrated circuit of claim 9, further comprising:
    means for loading the additional data from the first plurality of memory cells to the second plurality of memory cells if the comparing means indicates that data values in the portion of the second plurality of memory cells match data values of the portion of the first plurality of memory cells.

11. The integrated circuit of claim 9, further comprising:
    wherein the providing means repeats the providing of the data from the portion of the first plurality of memory cells to the portion of the second plurality of memory cells if the comparing means indicates that data values in the portion of the second plurality of memory cells do not match data values of the portion of the first plurality of memory cells; and
    wherein the comparing means repeats the comparing of data values stored in the portion of the second plurality of memory cells with data values of the portion of the first plurality of memory cells.

12. The integrated circuit of claim 9, wherein the first plurality of memory cells are non-volatile memory cells, and wherein the second plurality of memory cells are volatile memory cells.

13. The integrated circuit of claim 9, wherein the first plurality of memory cells is a test row of flash memory cells, and wherein the second plurality of memory cells is a test row of SRAM cells.

14. The integrated circuit of claim 9, wherein the additional data is configuration data, and wherein the integrated circuit is a programmable logic device.

15. A method of verifying data transfer within an integrated circuit, the method comprising:
    providing data from a portion of a first plurality of memory cells to a portion of a second plurality of memory cells;

storing the data provided from the first plurality of memory cells in the second plurality of memory cells;

comparing data values stored in the portion of the second plurality of memory cells with data values of the portion of the first plurality of memory cells; and controlling whether additional data from the first plurality of memory cells is loaded to the second plurality of memory cells.

16. The method of claim 15, further comprising:

loading the additional data from the first plurality of memory cells to the second plurality of memory cells if the comparing indicates that data values in the portion of the second plurality of memory cells match data values of the portion of the first plurality of memory cells.

17. The method of claim 15, further comprising:

repeating the providing of the data from the portion of the first plurality of memory cells to the portion of the second plurality of memory cells if the comparing indicates that data values in the portion of the second plurality of memory cells do not match data values of the portion of the first plurality of memory cells; and repeating the comparing of data values stored in the portion of the second plurality of memory cells with data values of the portion of the first plurality of memory cells.

18. The method of claim 15, wherein the first plurality of memory cells are non-volatile memory cells, and wherein the second plurality of memory cells are volatile memory cells.

19. The method of claim 15, wherein the first plurality of memory cells is a test row of flash memory cells, and wherein the second plurality of memory cells is a test row of SRAM cells.

20. The method of claim 15, wherein the additional data is configuration data, and wherein the integrated circuit is a programmable logic device.

* * * * *